United States Patent
Shimizu et al.

(10) Patent No.: US 9,455,219 B2
(45) Date of Patent: Sep. 27, 2016

(54) WIRING SUBSTRATE AND METHOD OF MANUFACTURING THE SAME

(71) Applicant: SHINKO ELECTRIC INDUSTRIES CO., LTD., Nagano-shi (JP)

(72) Inventors: Noriyoshi Shimizu, Nagano (JP); Wataru Kaneda, Nagano (JP); Akio Rokugawa, Nagano (JP); Toshinori Koyama, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 15 days.

(21) Appl. No.: 14/141,765

(22) Filed: Dec. 27, 2013

(65) Prior Publication Data

US 2014/0225275 A1 Aug. 14, 2014

(30) Foreign Application Priority Data

Feb. 13, 2013 (JP) ................. 2013-025210

(51) Int. Cl.
| | |
|---|---|
| H01L 29/41 | (2006.01) |
| H01L 23/498 | (2006.01) |
| H01L 21/768 | (2006.01) |
| H01L 21/48 | (2006.01) |

(52) U.S. Cl.
CPC ....... *H01L 23/49827* (2013.01); *H01L 21/486* (2013.01); *H01L 21/4857* (2013.01); *H01L 21/76804* (2013.01); *H01L 23/49822* (2013.01); *H01L 2224/16238* (2013.01); *H01L 2224/32225* (2013.01); *H01L 2224/32227* (2013.01); *H01L 2224/32235* (2013.01); *H01L 2224/73204* (2013.01); *H01L 2924/15311* (2013.01)

(58) Field of Classification Search
None
See application file for complete search history.

(56) References Cited

U.S. PATENT DOCUMENTS

| 6,329,610 B1* | 12/2001 | Takubo et al. ............... 174/264 |
|---|---|---|
| 6,375,693 B1* | 4/2002 | Cote et al. ................... 51/308 |
| 6,812,576 B1* | 11/2004 | Fazelpour et al. ............ 257/774 |
| 2002/0115292 A1* | 8/2002 | Andricacos et al. ......... 438/687 |
| 2002/0190835 A1* | 12/2002 | Ma et al. ..................... 336/223 |
| 2003/0219956 A1* | 11/2003 | Mori .................... H05K 1/162 438/393 |
| 2005/0110147 A1* | 5/2005 | Wu .................. H01L 21/76807 257/758 |
| 2007/0096328 A1* | 5/2007 | Takahashi et al. ........... 257/774 |
| 2009/0293271 A1* | 12/2009 | Tanaka .......................... 29/832 |
| 2012/0247814 A1* | 10/2012 | Shimizu et al. ............ 174/251 |

FOREIGN PATENT DOCUMENTS

JP  H11-126978  5/1999

* cited by examiner

*Primary Examiner* — Fei Fei Yeung Lopez
(74) *Attorney, Agent, or Firm* — Kratz, Quintos & Hanson, LLP

(57) ABSTRACT

A wiring substrate includes, a base wiring substrate including a first wiring layer, a first insulating layer in which the first wiring layer is buried and a first via hole is formed under the first wiring layer, and a second wiring layer formed under the first insulating layer and connected to the first wiring layer through the first via hole, and a re-wiring portion including a second insulating layer formed on the base wiring substrate and having a second via hole formed on the first wiring layer, and a re-wiring layer formed on the second insulating layer and connected to the first wiring layer through the second via hole. The re-wiring layer is formed of a seed layer and a metal plating layer provided on the seed layer, and the seed layer is equal to or wider in width than the metal plating layer.

5 Claims, 14 Drawing Sheets

WIRING SUBSTRATE AND METHOD OF MANUFACTURING THE SAME

CROSS-REFERENCE TO RELATED APPLICATIONS

This application is based upon and claims the benefit of priority of the prior Japanese Patent Application No. 2013-025210, filed on Feb. 13, 2013, the entire contents of which are incorporated herein by reference.

FIELD

This invention is related to a wiring substrate and a method of manufacturing the same.

BACKGROUND

In the prior art, there are wiring substrates for mounting electronic components such as semiconductor chips. In recent years, along with the advancement in the performance of electronic components, the further higher density of wirings and the further multi-layered wirings of wiring substrates have been advanced.

A related art is disclosed in Japanese Laid-open Patent Publication No. 11-126978.

SUMMARY

As explained in the column of preliminary matter described later, a high-performance semiconductor chip is mounted on a wiring substrate while being pitch-converted through a silicon interposer.

When the silicon interposer is manufactured, it is necessary to form through holes in a silicon substrate by dry etching or the like, form penetrating electrodes in the through holes by electroplating, and form fine wiring layers on both faces of the substrate.

In the manufacture of such silicon interposer, there is a problem that the technical hurdle is high, and manufacturing cost is increased.

One aspect of the following disclosure provides a wiring substrate, including a base wiring substrate including a first wiring layer, a first insulating layer in which the first wiring layer is buried and a first via hole is formed under the first wiring layer, and a second wiring layer formed under the first insulating layer and connected to the first wiring layer through a via conductor in the first via hole, and a re-wiring portion including a second insulating layer formed on the base wiring substrate, the second insulating layer in which a second via hole is formed on the first wiring layer, and a re-wiring layer formed on the second insulating layer and connected to the first wiring layer through a via conductor in the second via hole, wherein the re-wiring layer is formed of a seed layer and a metal plating layer formed on the seed layer, and a width of the seed layer is equal to or wider than a width of the metal plating layer.

Another aspect of the disclosure provides a method of manufacturing a wiring substrate, including forming a first wiring layer on a metal plate, forming a first insulating layer on the metal plate, the first insulating layer in which a first via hole is provided on the first wiring layer, forming a second wiring layer on the first insulating layer, the second wiring layer being connected to the first wiring layer through a via conductor in the first via hole, removing the metal plate, forming a second insulating layer on the first insulating layer, the second insulating layer in which a second via hole is provided on the first wiring layer, forming a seed layer in the second via hole and on the second insulating layer, forming a plating resist in which an opening portion is provided in an area including the second via hole, forming a metal plating layer in the second via hole and the opening portion of the plating resist by electroplating, removing the plating resist, and forming a re-wiring layer by removing the seed layer by anisotropic dry etching while using the metal plating layer as a mask.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENT

Hereinbelow, an embodiment will be described with reference to the accompanying drawings.

Before describing the embodiment, a preliminary matter that forms the basis will be described. In recent years, along with the advancement in the performance of semiconductor chips, the narrower pitch of connection pads has been advancing. Therefore, it is becoming difficult to mount a semiconductor chip directly on a wiring substrate.

Figure 1:
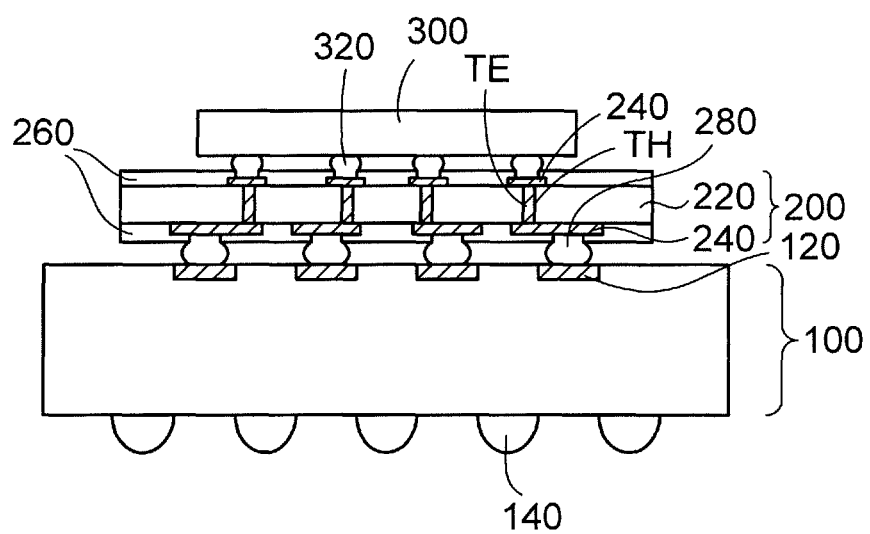
FIG. 1 is a cross-sectional view depicting a semiconductor device according to a preliminary matter.

For this reason, as depicted in FIG. 1, the technique in which a semiconductor chip 300 is connected to a wiring substrate 100 through a silicon interposer 200 has been developed.

The wiring substrate 100 includes connection pads 120 on its upper face side and external connection terminals 140 on its lower face side.

In the silicon interposer 200, through holes TH are provided in a silicon substrate 220, and penetrating electrodes TE are formed in the through holes TH. Wiring layers 240 are formed on both faces of the silicon substrate 200 and connected to each other through the penetrating electrodes TE.

Moreover, insulating layers 260 are formed on both faces of the silicon substrate 220 respectively, the insulating layers 260 in which opening portions are provided on the wiring layers 240.

Further, the wiring layer 240 on the lower face side of the silicon interposer 200 is connected to the connection pads 120 of the wiring substrate 100 through connection terminals 280. Furthermore, bump electrodes 320 of the semiconductor chip 300 are connected to the wiring layer 240 on the upper face side of the silicon interposer 200.

In this way, the bump electrodes 320 of the semiconductor chip 300 arranged at a narrow pitch are connected to the silicon interposer 200 including fine wirings, and thereby the pitch is converted from the silicon interposer 200 to the wiring substrate 100.

When the silicon interposer 200 is manufactured, it is necessary to form the through-holes TH in the silicon substrate 220 by dry etching or the like, form the penetrating electrodes TE in the through-holes TH by electroplating, and form the fine wiring layers 240 on both faces of the silicon substrate 220.

In such method, the technical hurdle is high, and the maker which can manufacture is restricted. Moreover, This method requires installation of a costly manufacturing apparatus and execution of complicated manufacturing processes. Thus, there is a problem that manufacturing cost is increased.

The embodiment to be described below can solve the problem mentioned above.

EMBODIMENT

Figure 12A:
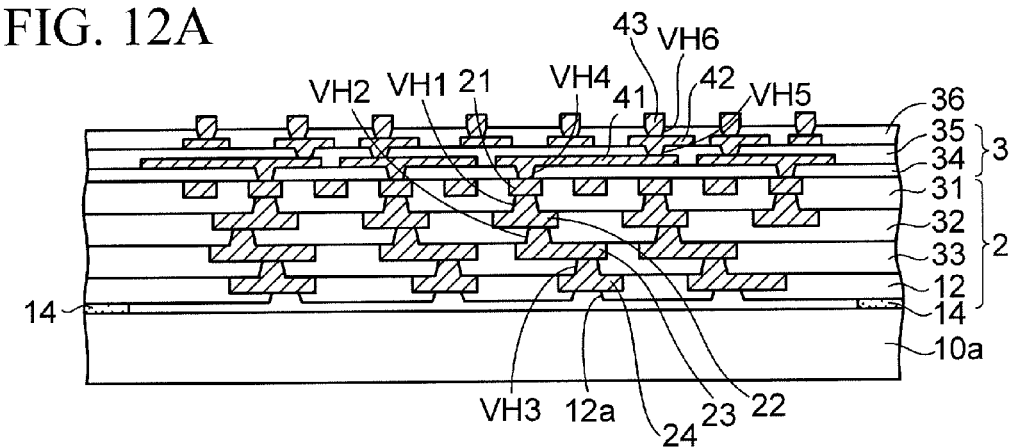
FIGS. 12A and 12B are cross-sectional views depicting the method of manufacturing a wiring substrate of the embodiment (Part 7).
Figure 12B:
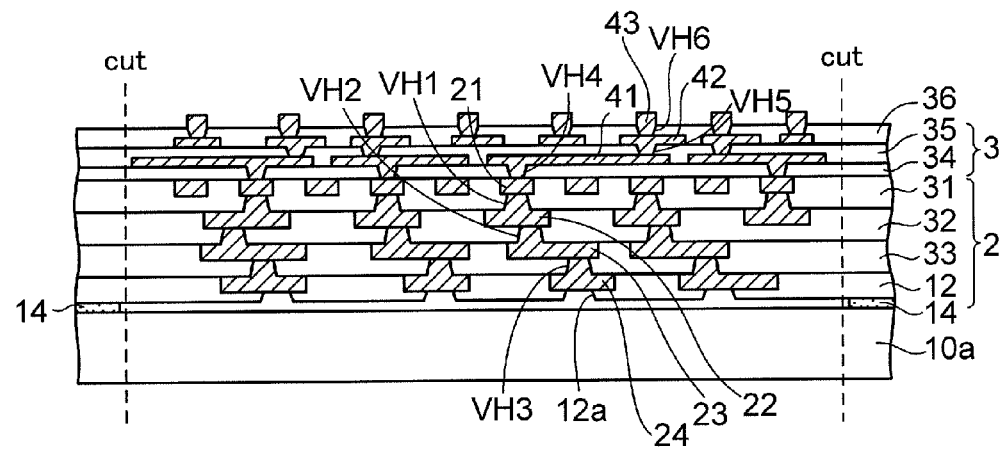
Figure 13:
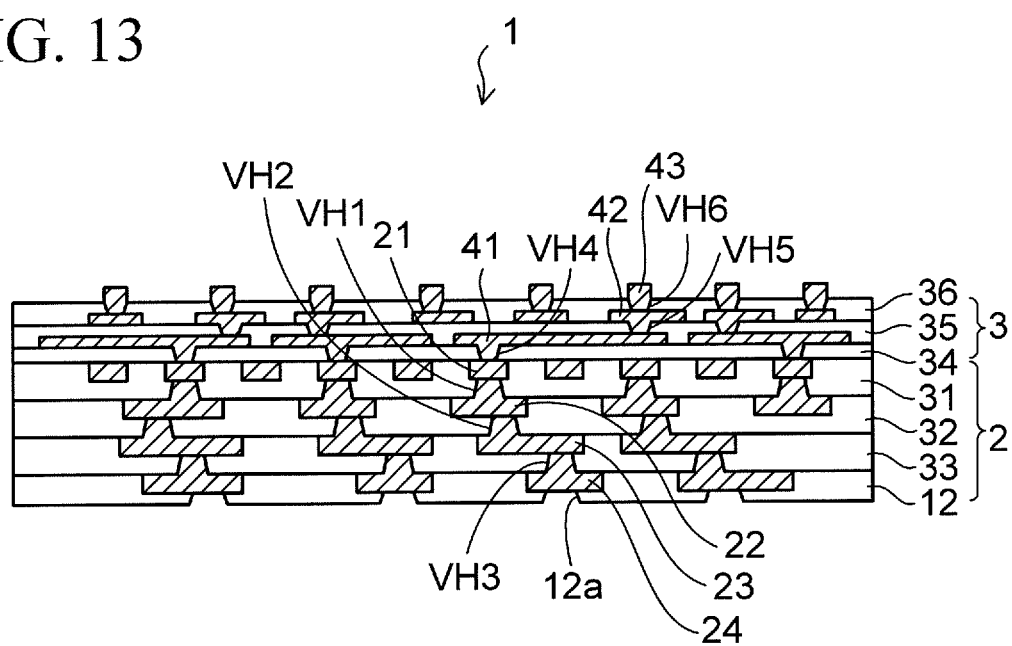
FIG. 13 is a cross-sectional view depicting a wiring substrate of the embodiment.

FIGS. 2A to 12B are cross-sectional views depicting a method of manufacturing a wiring substrate of the embodiment, and FIG. 13 is a cross-sectional view depicting a wiring substrate of the embodiment. Hereinafter, while explaining a method of manufacturing a wiring substrate, a structure of a wiring substrate will be explained.

Figure 2A:
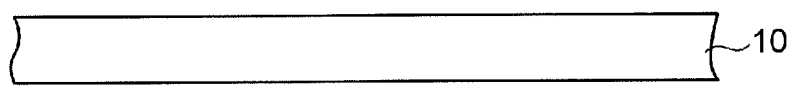
FIGS. 2A to 2D are cross-sectional views depicting a method of manufacturing a wiring substrate of an embodiment (Part 1).

In the method of manufacturing a wiring substrate of the embodiment, as depicted in FIG. 2A, first, a first metal plate 10 is prepared as a temporary substrate. As an example of the first metal plate 10, a copper plate or a copper foil whose thickness is 1 mm to 10 mm is used.

Figure 2B:
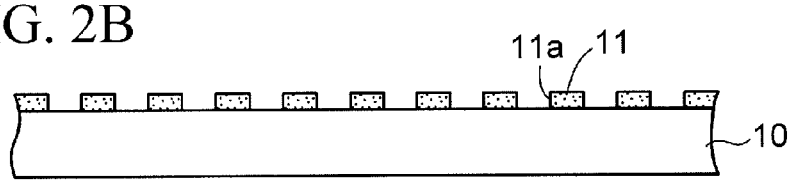

Then, as depicted in FIG. 2B, a plating resist 11 in which opening portions 11a are provided is formed on the first metal plate 10. The plating resist 11 is formed by attaching a dry film resist on the first metal plate 10 and exposing and developing it by the photolithography.

Figure 2C:
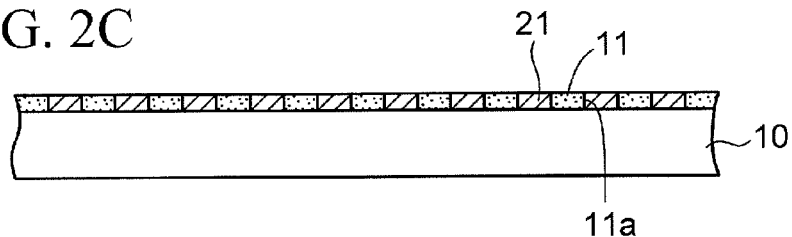

Then, as depicted in FIG. 2C, a first wiring layer 21 is formed by applying the metal-plating into the opening portions 11a of the plating resist 11, by means of electroplating utilizing the first metal plate 10 as a plating power feeding path.

Figure 2D:
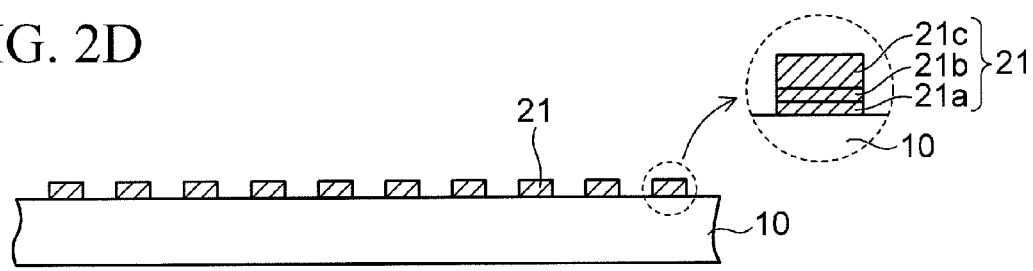

Thereafter, as depicted in FIG. 2D, the plating resist 11 is removed. In FIG. 2D, connection pads are depicted as the first wiring layer 21. The first wiring layer 21 may be connection pads arranged like the islands, otherwise the first wiring layer 21 may have the lead-out wirings and the connection pads arranged to be connected to the ends of the lead-out wirings.

As depicted in the partial cross-sectional view in FIG. 2D, the first wiring layer 21 is formed of laminated films including a gold (Au) layer 21a whose thickness is 0.5 μm, a nickel (Ni) layer 21b whose thickness is 1 μm, and a copper (Cu) layer 21c whose thickness is 10 μm in this order from the bottom.

The lowermost layer of the first wiring layer is formed of a metal which functions as a stopper when the first metal plate 10 is removed by wet etching. Although the first metal plate 10 is formed of copper and the gold layer 21a is formed as the lowermost layer of the first wiring layer 21 in the above example, it is possible to employ a different combination of metals.

Figure 3A:
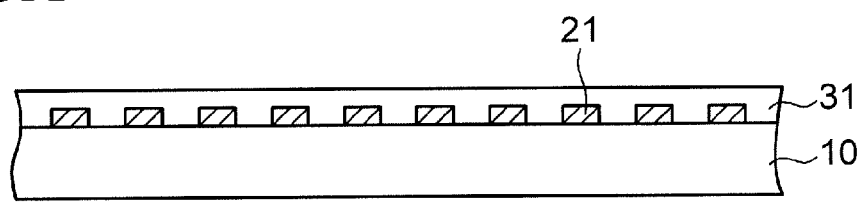
FIGS. 3A to 3C are cross-sectional views depicting the method of manufacturing a wiring substrate of the embodiment (Part 2).

Then, as depicted in FIG. 3A, an uncured resin film of an epoxy resin, a polyimide resin, or the like is attached onto the first metal plate 10 and the first wiring layer 21 and pressed with heat to thereby form a first interlayer insulating layer 31. The thickness of the first interlayer insulating layer 31 is 20 μm to 40 μm. The first interlayer insulating layer 31 may be formed of a resin containing glass cloth.

Figure 3B:
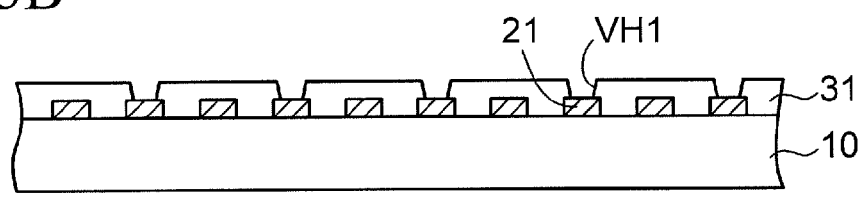

Thereafter, as depicted in FIG. 3B, the first interlayer insulating layer 31 is processed by a laser to form first via holes VH1 reaching the first wiring layer 21. As the laser, a $CO_2$ laser, a UV-YAG laser, an excimer laser, or the like is used. The diameter of each first via hole VH1 is 20 μm to 60 μm.

Each first via hole VH1 is formed in a taper shape in which the diameter is set small gradually from the upper face of the first interlayer insulating layer 31 toward the thickness direction thereof.

Figure 3C:
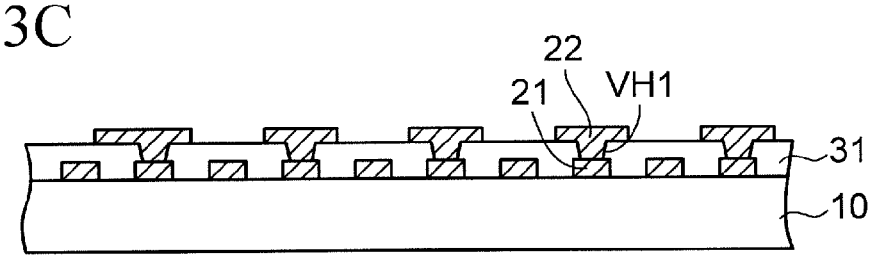

Then, as depicted in FIG. 3C, a second wiring layer 22 is formed which is connected to the first wiring layer 21 through a via conductor in the first via hole VH1. The second wiring layer 22 is formed by a semi-additive method.

Figure 4A:
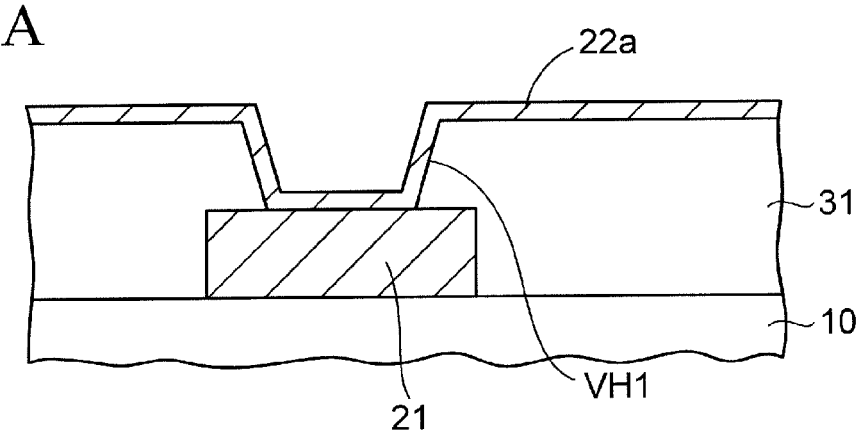
FIGS. 4A to 4C are cross-sectional views depicting a method of forming a second wiring layer in FIG. 3C (Part 1).

Specifically, as depicted in FIG. 4A, first, a seed layer 22a made of copper or the like, whose thickness is 1 μm, is formed in the first via holes VH1 and on the first interlayer insulating layer 31 by electroless plating.

Figure 4B:
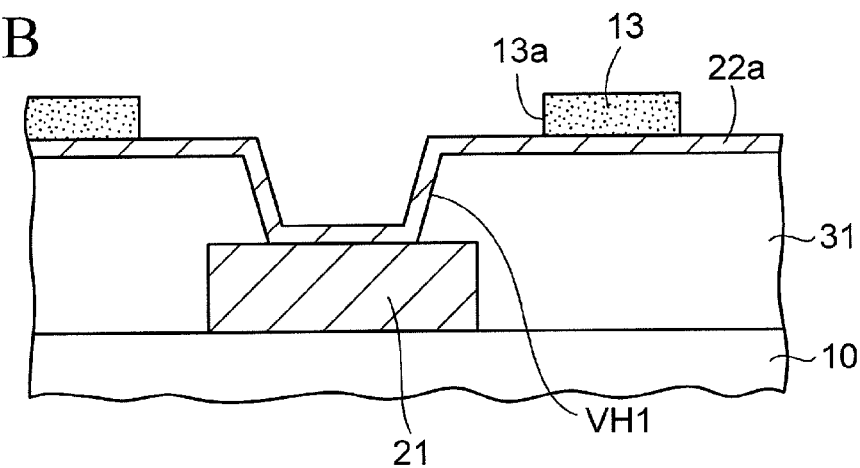

Further, as depicted in FIG. 4B, a plating resist 13 is formed on the seed layer 22a, the plating resist 13 in which opening portions 13a are provided in areas including the first via holes VH1.

Figure 4C:
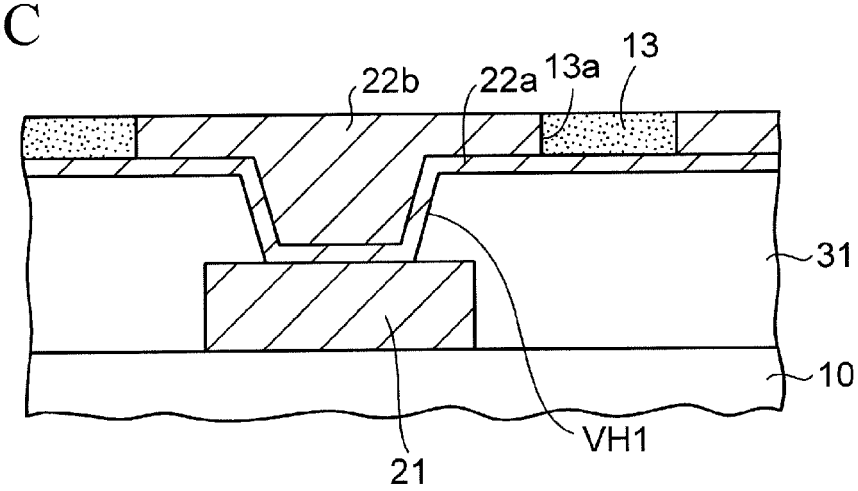

Then, as depicted in FIG. 4C, a metal plating layer 22b made of copper or the like is formed from the inside of the first via holes VH1 to the opening portions 13a of the plating resist 13 by electroplating utilizing the seed layer 22a as a plating power feeding path.

Figure 5A:
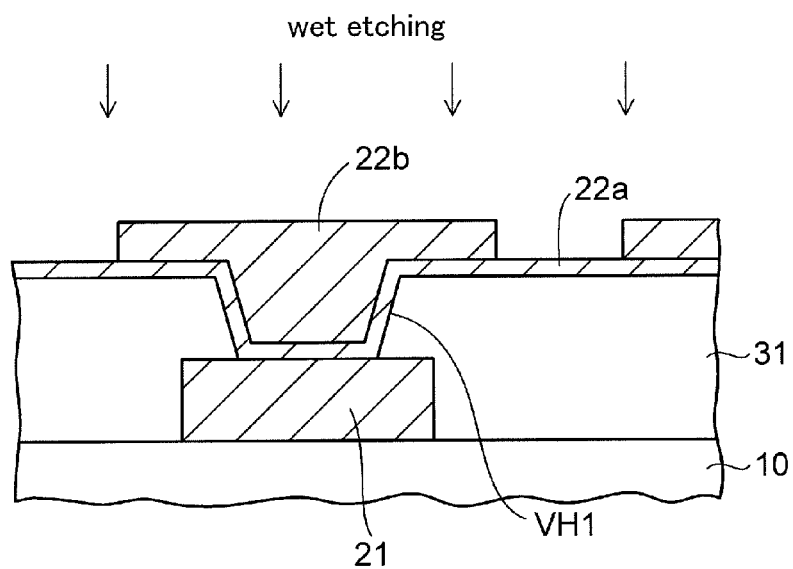
FIGS. 5A and 5B are cross-sectional views depicting the method of forming the second wiring layer in FIG. 3C (Part 2).

Further, as depicted in FIG. 5A, the plating resist 13 is removed to expose the seed layer 22a.

Figure 5B:
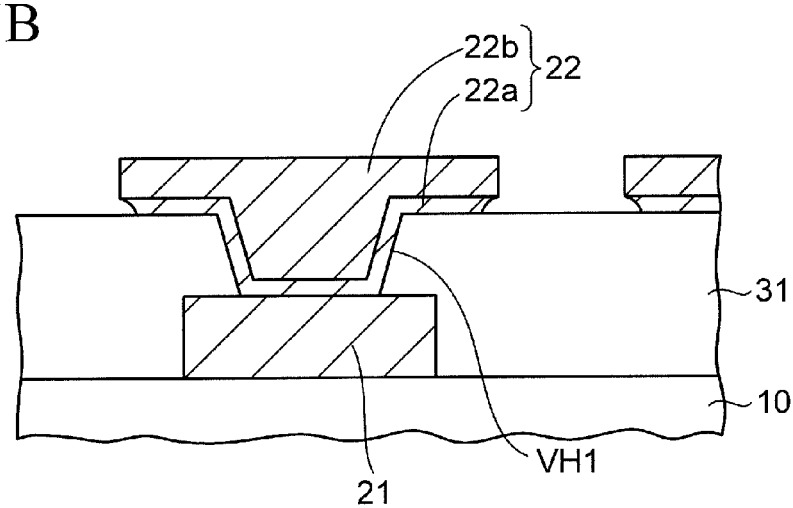

Thereafter, the seed layer 22a is removed by wet etching while using the metal plating layer 22b as a mask. By this matter, as depicted in FIG. 5B, the second wiring layer 22 is formed from the seed layer 22a and the metal plating layer 22b.

At this time, the etching rate of the seed layer 22a formed by electroless plating is considerably higher than the etching rate of the metal plating layer 22b formed by electroplating.

For this reason, the seed layer 22a is etched into an undercut shape that cut into from the side face of the metal plating layer 22b toward the inside thereof. Moreover, since the wet etching is isotropic etching, the second wiring layer is formed in a state that the width of the metal plating layer 22b is narrowed.

Figure 6A:
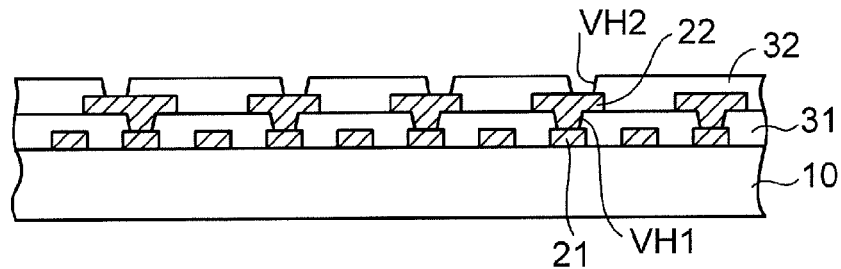
FIGS. 6A to 6D are cross-sectional views depicting the method of manufacturing a wiring substrate of the embodiment (Part 3).

Then, as depicted in FIG. 6A, by a method similar to the method of forming the first interlayer insulating layer 31 in FIG. 3A mentioned above, a second interlayer insulating layer 32 is formed on the first interlayer insulating layer 31 and the second wiring layer 22. Further, similarly to FIG. 3B mentioned above, second via holes VH2 are formed in the second interlayer insulating layer 32, the second via holes VH2 reaching the second wiring layer 22.

Figure 6B:
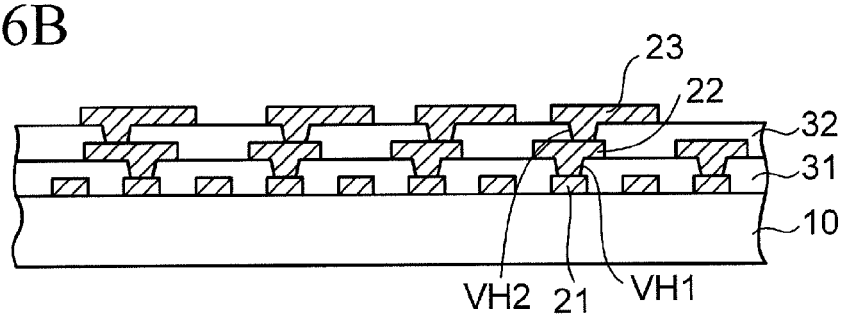

Thereafter, as depicted in FIG. 6B, by a method similar to that in FIGS. 4A to 5B, a third wiring layer 23 is formed on the second interlayer insulating layer 32, the third wiring layer 23 being connected to the second wiring layer 22 through a via conductor in the second via hole VH2.

Figure 6C:
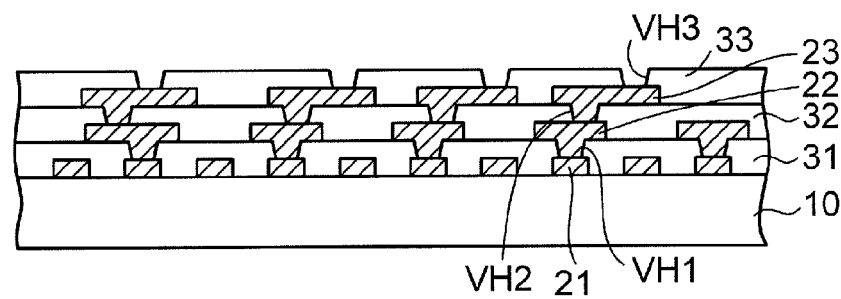

Moreover, as depicted in FIG. 6C, by a method similar to the method of forming the first interlayer insulating layer 31 in FIG. 3A mentioned above, a third interlayer insulating layer 33 is formed on the second interlayer insulating layer 32 and the third wiring layer 23. Further, similarly to FIG. 3B mentioned above, third via holes VH3 are formed in the third interlayer insulating layer 33, the third via holes VH3 reaching the third wiring layer 23.

Figure 6D:
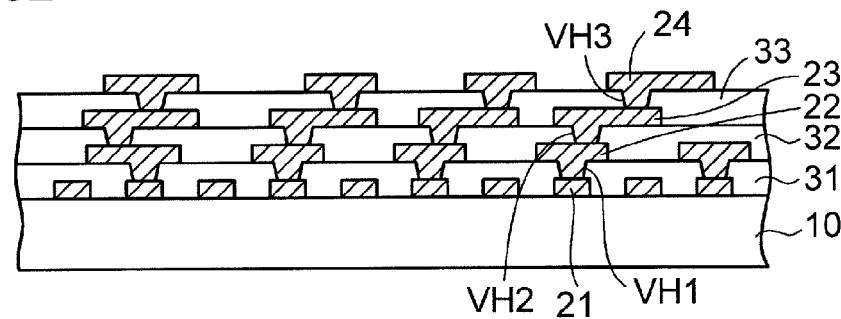

Furthermore, as depicted in FIG. 6D, by a method similar to that in FIGS. 4A to 5B, a fourth wiring layer 24 is formed on the third interlayer insulating layer 33, the fourth wiring layer 24 being connected to the third wiring layer 23 through a via conductor in the third via hole VH3. The thickness of each of the second to fourth wiring layers 22, 23, and 24 is set to about 15 μm, for example. Moreover, the line (wiring width):space (wiring distance) of the first to fourth wiring layers 21 to 24 is selected from a range of 10 μm:10 μm to 50 μm:50 μm, for example.

Figure 7A:
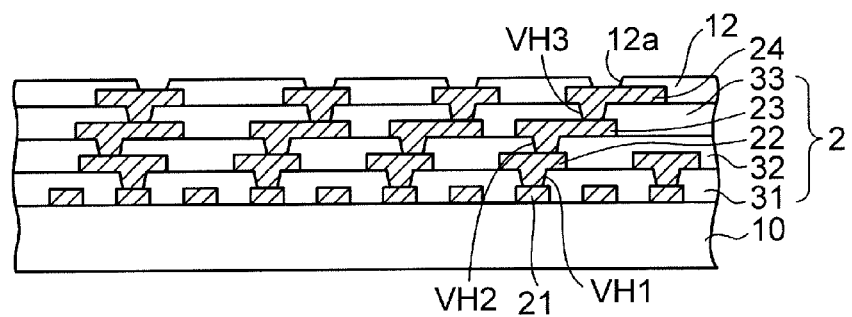
FIGS. 7A to 7C are cross-sectional views depicting the method of manufacturing a wiring substrate of the embodiment (Part 4).

Then, as depicted in FIG. 7A, a solder resist 12 is formed on the third interlayer insulating layer 33 as a protection insulating layer, the solder resist in which opening portions 12a are provided on connecting parts of the fourth wiring layer 24.

By the above steps, a base wiring substrate 2 including the first to fourth wiring layers 21 to 24 is formed on the first metal plate 10.

Figure 7B:
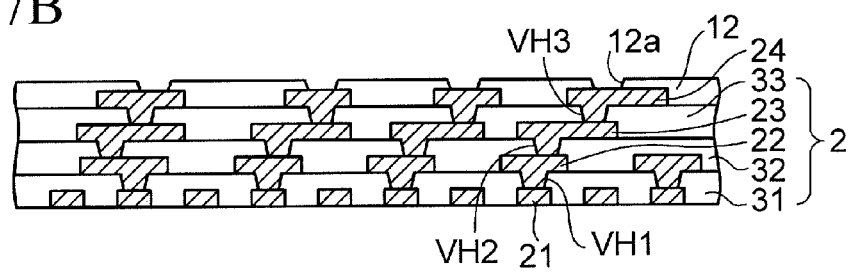

Thereafter, as depicted in FIG. 7B, the first metal plate 10 is removed by wet etching. An ammonium-based alkaline solution is used as the etchant of the wet etching.

At this time, the lowermost gold layer 21a (FIG. 2D) of the first wiring layer 21 and the first interlayer insulating layer 31 are exposed and function as a stopper in the wet etching. Thereby, the corrosion of the nickel layer 21b and the copper layer 21c (FIG. 2D) in the first wiring layer 21 is prevented.

By the above steps, the first metal plate 10 is removed from the structure in FIG. 7A, so that the base wiring substrate 2 is obtained. The base wiring substrate 2 is manufactured as a coreless substrate having no core substrate. The lower face of the first wiring layer 21 and the lower face of the first interlayer insulating layer 31 in the base wiring substrate 2 are exposed so as to constitute an identical face each other.

Figure 7C:
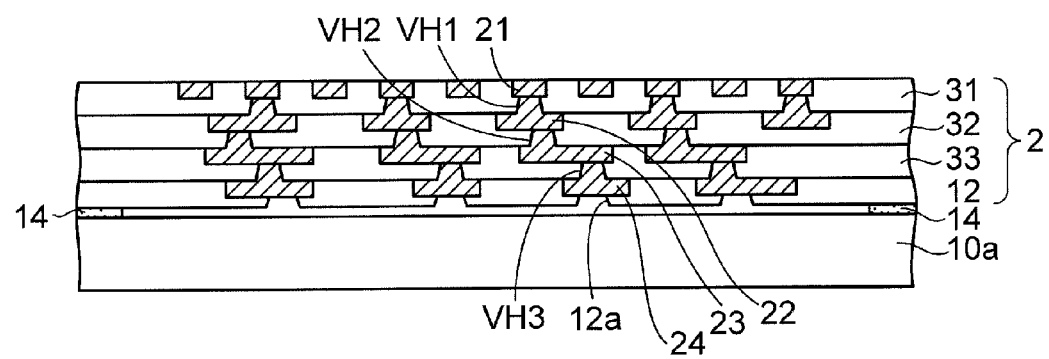

Then, as depicted in FIG. 7C, a second metal plate 10a such as a copper plate or the like is prepared. Thereafter, the base wiring substrate 2 in FIG. 2B is reversed up and down, and the base wiring substrate 2 is arranged on the second metal plate 10a through epoxy resin-based adhesive 14. In this step, the adhesive 14 is arranged only on an outer peripheral part of the base wiring substrate 2.

Further, the stacked body is pressed with heat in a vacuum condition to cure the adhesive 14, so that the base wiring substrate 2 and the second metal plate 10a are partially bonded.

By this matter, the peripheral part of the second metal plate 10a is bonded to the base wiring substrate 2, thus it is in a state that a center part of the second metal plate 10a is arranged simply on the base wiring substrate 2.

Also, it is in a state that the gold layer 21a (FIG. 2D) of the first wiring layer 21 is exposed on the upper face of the base wiring substrate 2. The upper face of the first wiring layer 21 and the upper face of the first interlayer insulating layer 31 in the base wiring substrate 2 constitute an identical face each other.

In this embodiment, instead of using the silicon interposer 200 described in the preliminary matter, a re-wiring portion having fine wirings similar to those in the silicon interposer 200 is formed directly on the base wiring substrate 2.

Figure 8A:
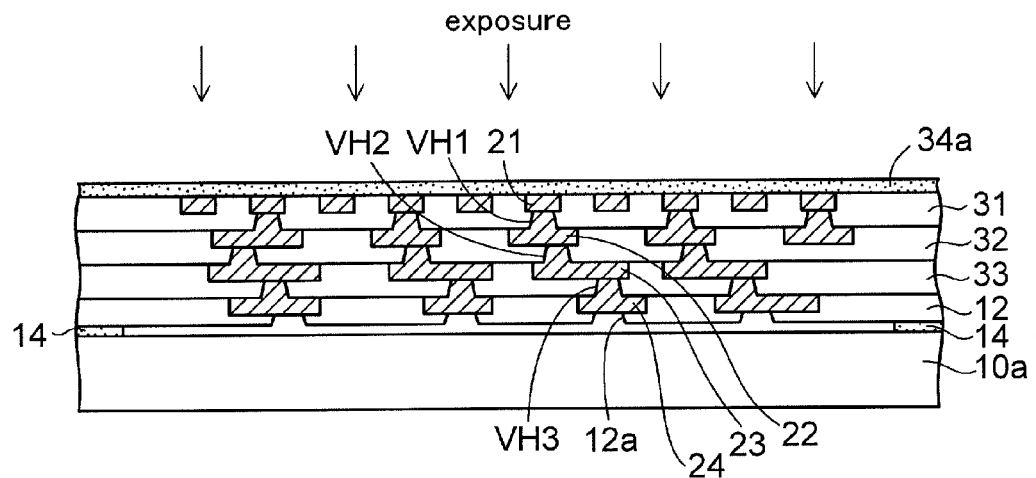
FIGS. 8A to 8C are cross-sectional views depicting the method of manufacturing a wiring substrate of the embodiment (Part 5).

First, as depicted in FIG. 8A, a liquid resin layer 34a having photosensitivity is coated on the flat upper face of the base wiring substrate 2. Further, on the basis of the photo-lithography, the liquid resin layer 34a is exposed through a photomask (not depicted), and is developed, and subjected to a baking process to be cured.

Figure 8B:
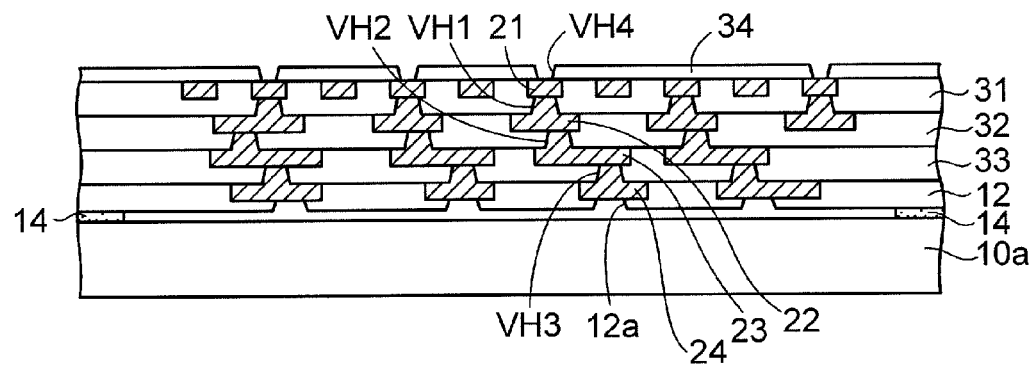

By this matter, as depicted in FIG. 8B, a fourth interlayer insulating layer 34 is formed on the upper face of the base wiring substrate 2, the fourth interlayer insulating layer 34 in which fourth via holes VH4 reaching the first wiring layer 21 are provided.

In order to form a fine re-wiring portion on the base wiring substrate 2, the thickness of the fourth interlayer insulating layer 34 is set to be thinner than the thickness of the first to third interlayer insulating layers 31 to 33 of the base wiring substrate 2.

For example, the thickness of the fourth interlayer insulating layer 34 is 2 μm to 10 μm and is preferably about 5 μm, and the diameter of each fourth via hole VH4 is 10 μm to 20 μm.

The upper face of the base wiring substrate 2 is flat and the thickness of the fourth interlayer insulating layer 34 is thin. From the matter, the focus depth of the photolithography can be secured sufficiently. Therefore, fine fourth via holes VH4 can be formed uniformly and accurately in the base wiring substrate 2.

Each fourth via hole VH4 in the fourth interlayer insulating layer 34 is arranged on the base wiring substrate 2 which has been reversed up and down in the middle of the manufacturing, and is formed in a taper shape in which the diameter is set small gradually from the upper face toward the thickness direction. For this reason, the fourth via hole VH4 is arranged with a taper shape reverse to the first via holes VH1 in the base wiring substrate 2.

Figure 8C:
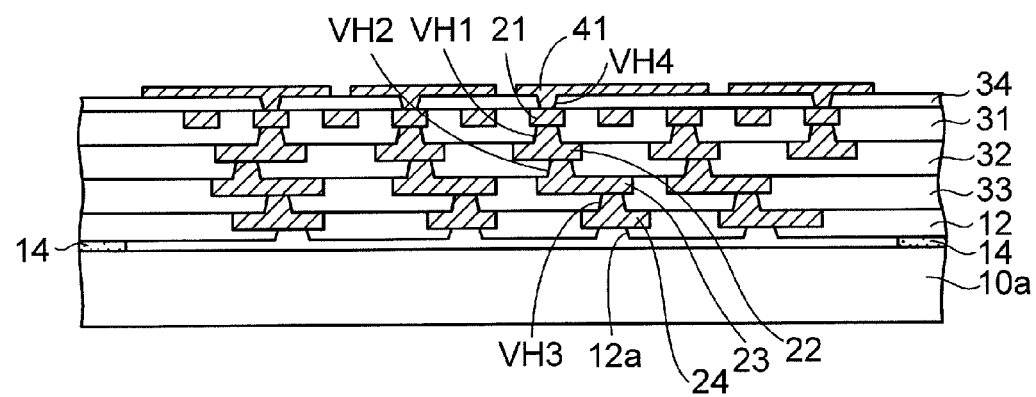

Then, as depicted in FIG. 8C, a first re-wiring layer 41 is formed on the fourth interlayer insulating layer 34, the first re-wiring layer 41 being connected to the first wiring layer 21 through a via conductor in each fourth via hole VH4. The first re-wiring layer 41 is formed by a semi-additive method.

Figure 9A:
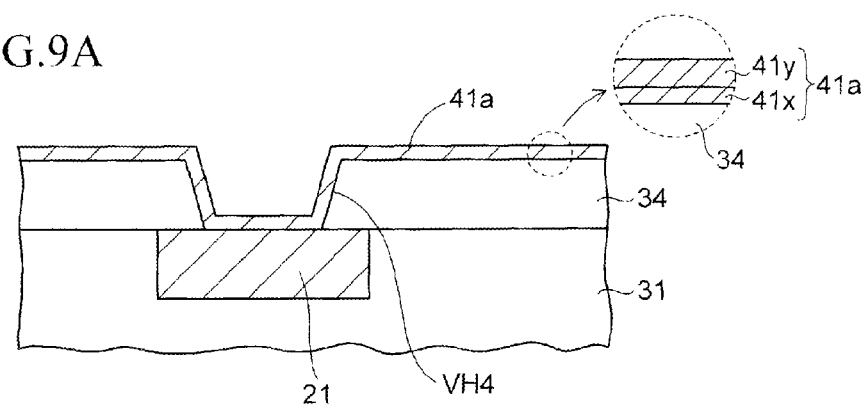
FIGS. 9A to 9C are cross-sectional views depicting a method of forming a first re-wiring layer in FIG. 8C (Part 1).

Specifically, as depicted in FIG. 9A, first, a seed layer 41a is formed in the fourth via holes VH4 and on the fourth interlayer insulating layer 34 by sputtering. As depicted in the partial cross-sectional view in FIG. 9A, the seed layer 41a is formed of a titanium (Ti) layer 41x whose thickness is 20 nm and a copper (Cu) layer 41y whose thickness is 300 nm in this order from bottom.

The titanium layer 41x functions as an adhesion layer that the fourth interlayer insulating layer 34 (resin) and the copper layer 41y are made to adhere.

By forming the seed layer 41a by sputtering, the reliability of the film formation is higher than when electroless plating is employed. Therefore, the thickness of the seed layer 41a can be set thinly. Accordingly, the seed layer 41a can be etched easily, thus it can respond to the miniaturization of the re-wiring layer.

Figure 9B:
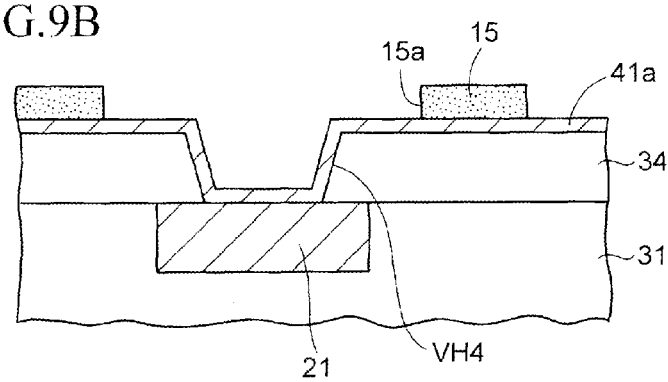

Thereafter, as depicted in FIG. 9B, a plating resist 15 is formed on the seed layer 41a, the plating resist 15 in which opening portions 15a are provided in areas including the fourth via holes VH4.

At this time, since the upper face of the base wiring substrate 2 is flat, the focus depth of the photolithography can be secured sufficiently. Therefore, the opening portions 15a of the plating resist 15 can be formed uniformly and accurately in the base wiring substrate 2.

Figure 9C:
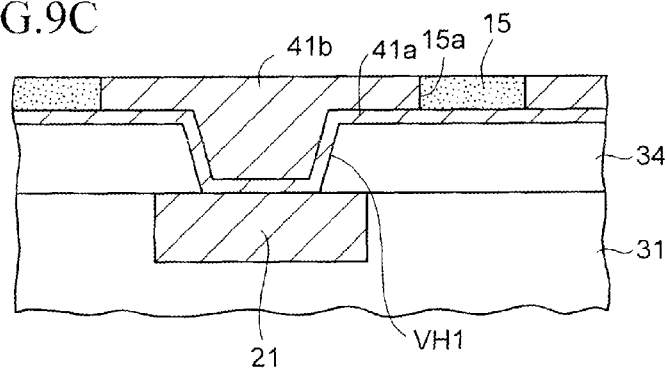

Then, as depicted in FIG. 9C, by electroplating utilizing the seed layer 41a as a plating power feeding path, a metal plating layer 41b formed of copper or the like is formed from the inside of the fourth via holes VH4 to the opening portions 15a of the plating resist 15. The thickness of the metal plating layer 41b is set to 1 μm to 4 μm, for example.

Figure 10A:
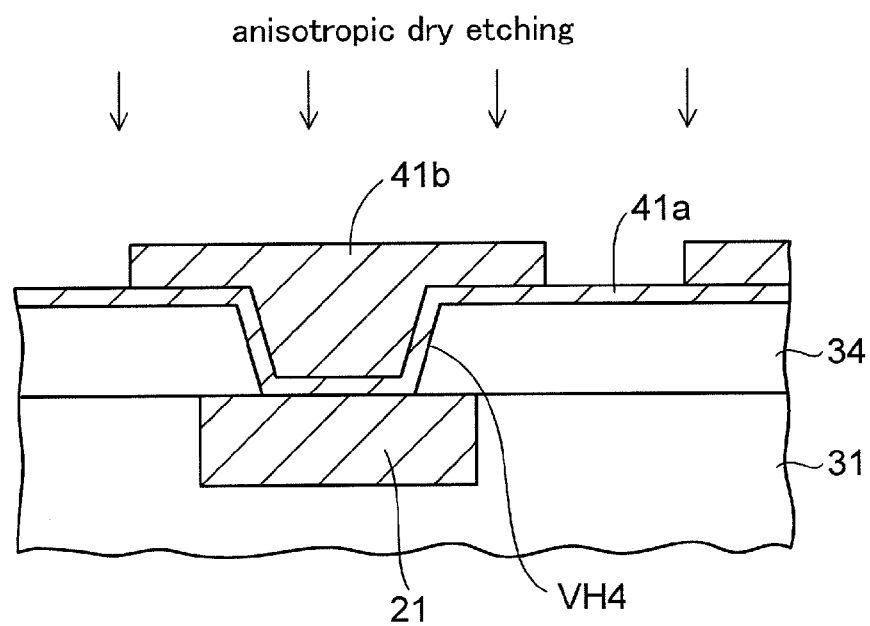
FIGS. 10A and 10B are cross-sectional views depicting the method of forming the first re-wiring layer in FIG. 8C (Part 2).

Further, as depicted in FIG. 10A, the plating resist 15 is removed to expose the seed layer 41a. Thereafter, by anisotropic dry etching using a chlorine-containing gas, the seed layer 41a is etched and removed while using the metal plating layer 41b as a mask.

Figure 10B:
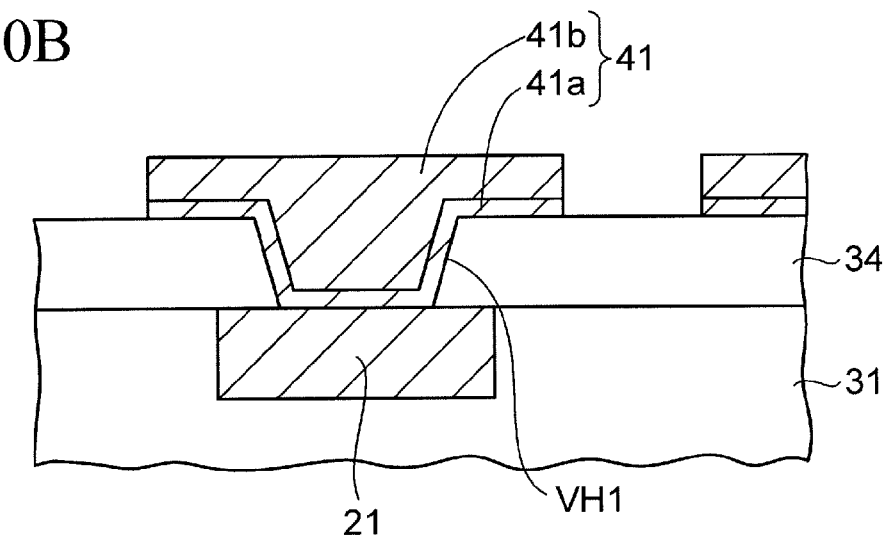

By this matter, as depicted in FIG. 10B, the first re-wiring layer 41 is formed from the seed layer 41a and the metal plating layer 41b. The total thickness of the first re-wiring layer 41 is about 5 μm or less and is preferably 2 μm to 3 μm.

The anisotropic dry etching is performed by a dry etching apparatus such as an RIE (Reactive Ion Etching) apparatus or an ICP (Inductively Coupled Plasma) apparatus.

By employing the anisotropic dry etching, the narrowing of the metal plating layer 41 is suppressed slightly, and also the seed layer 41a is not side-etched from the side face of the metal plating layer 41b to the inside thereof. In addition, by employing the sputtering, the seed layer 41a can be made thin, which is advantageous in the miniaturization of the wiring layer.

For this reason, the fine re-wiring layer 41 having a line:space of 1 μm:1 μm to 5 μm:5 μm can be formed within a design specification at a good yield.

In the case that the seed layer 41a is formed of copper, the volatility of the copper chloride produced during the drying etching is low. Therefore, it is preferable to set the temperature of the stage of the etching apparatus to 100° C. to 200° C. and perform the etching in a high-temperature atmosphere.

As explained in FIGS. 4A to 5B mentioned above, in the case that the seed layer is removed by wet etching, the narrowing and the pattern jump of the first re-wiring layer 41 is easy to occur, thereby it is difficult to form the fine first re-wiring layer 41 at a good yield.

In this way, the width of the first re-wiring layer 41 can be set to be narrower than the width of any of the first to fourth wiring layers 21 to 24 of the base wiring substrate 2.

Moreover, when the first re-wiring layer 41 is formed, the seed layer 41a is removed by the anisotropic dry etching. Therefore, the width of the seed layer 41a is equal to or wider than the width of the metal plating layer 41b. In the example of FIG. 10B, the width of the seed layer 41a is equal to the width of the metal plating layer 41b.

Besides the above case, depending upon the condition of the dry etching, in some case, the width of the seed layer 41a may be wider than the width of the metal plating layer 41b such that the side face of the seed layer 41a is in a skirt shape spreading gradually as the position is located from the lower end of the metal plating layer 41b toward a lower side.

Figure 11A:
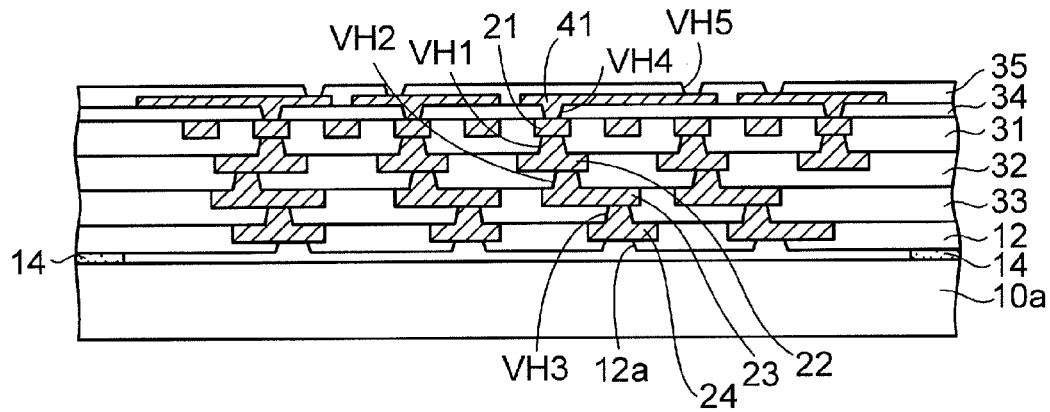
FIGS. 11A to 11C are cross-sectional views depicting the method of manufacturing a wiring substrate of the embodiment (Part 6).

Then, as depicted in FIG. 11A, by a method similar to that in FIGS. 8A and 8B mentioned above, a fifth interlayer insulating layer 35 is formed on the fourth interlayer insulating layer 34, the fifth interlayer insulating layer 35 in which fifth via holes VH5 are provided on the first re-wiring layer 41.

Figure 11B:
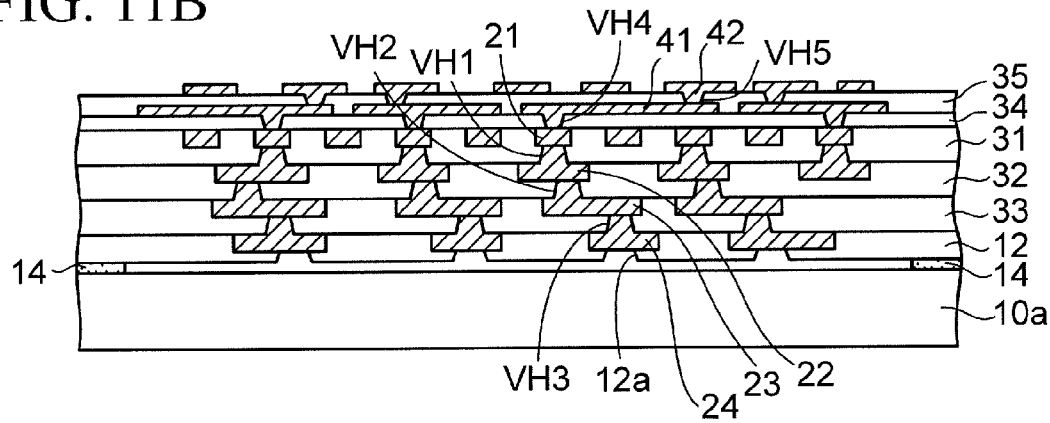

Thereafter, as depicted in FIG. 11B, by a method similar to that in FIGS. 9A to 10B, a second re-wiring layer 42 is formed on the fifth interlayer insulating layer 35, the second re-wiring layer 42 being connected to the first re-wiring layer 41 through a via conductor in each fifth via hole VH5.

Figure 11C:
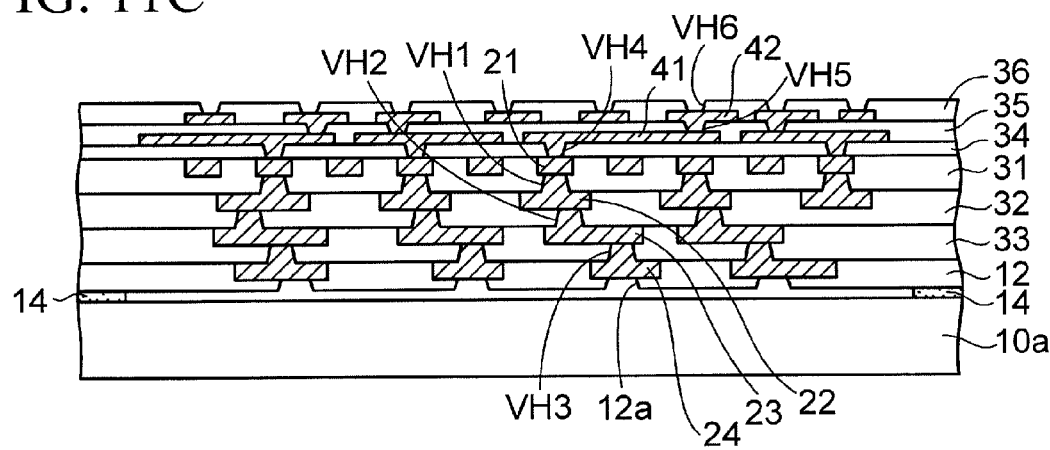

Further, as depicted in FIG. 11C, by a method similar to that in FIGS. 8A and 8B mentioned above, a sixth interlayer insulating layer 36 is formed on the fifth interlayer insulating layer 35, the sixth interlayer insulating layer 36 in which sixth via holes VH6 are provided on the second re-wiring layer 42.

Then, as depicted in FIG. 12A, by a method similar to that in FIGS. 9A to 10B, a third re-wiring layer 43 is formed in the sixth via holes VH6, the third re-wiring layer 43 being connected to the second re-wiring layer 42. The third re-wiring layer 43 is formed as a post electrode protruding upward from each sixth via hole VH6. The third re-wiring layer 43 is formed with a height of about 10 μm from the upper face of the sixth interlayer insulating layer 36.

By the above steps, a re-wiring portion 3 including the first to third re-wiring layers 41, 42, and 43 and the fourth to sixth interlayer insulating layers 34, 35, and 36 is formed on the base wiring substrate 2.

Then, as depicted in FIG. 12B, the structure in FIG. 12A is cut from the upper face of the sixth interlayer insulating layer 36 to the lower face of the second metal plate 10a at positions inside the area where the adhesive 14 is arranged. At this time, in the structure in FIG. 12B, the second metal plate 10a and the base wiring substrate 2 are not adhered to each other in the area inside the position of the adhesive 14, and therefore they can be separated from each other easily.

By this matter, as depicted in FIG. 13, a wiring substrate 1 of this embodiment is obtained.

As described above, in the method of manufacturing a wiring substrate of this embodiment, the base wiring substrate 2 is formed on the first metal plate 10, and then the first metal plate 10 is removed. Thereafter, the re-wiring portion 3 is formed on the flat exposed face of the base wiring substrate 2, the re-wiring portion 3 being connected to the first wiring layer 21.

In the re-wiring portion 3, by patterning a photosensitive resin material by means of the photolithography, the fourth to sixth interlayer insulating layers 34, 35, and 36, which are thin films having fine via holes and having a thickness of about 5 μm, can each be formed.

Moreover, when the first re-wiring layer 41 or the like is formed by a semi-additive method, the seed layer 41a is formed as a thin film by sputtering, and anisotropic dry etching is employed upon removing the seed layer 41a while using the metal plating layer 41b as a mask.

By using such dry process, it is possible to form the fine first to third re-wiring layers 41 to 43 equivalent to the silicon interposer.

Here, the first to third re-wiring layers 41 to 43 are each formed by a semi-additive method in the mode described above. However, as an alternative mode, each re-wiring layer may be formed by forming metal layers such as a titanium layer and a copper layer on the entire surface by sputtering, and then forming a resist pattern by the photolithography, and then etching the metal layers by anisotropic dry etching.

As depicted in FIG. 13, the wiring substrate 1 of this embodiment includes the base wiring substrate 2 and the re-wiring portion 3 formed thereon.

Since the wiring substrate 1 of this embodiment is manufactured by the manufacturing method described above, the first interlayer insulating layer 31 is arranged to the lateral direction and lower sides of the first wiring layer 21 in the base wiring substrate 2. The lower face and side face of the first wiring layer 21 are buried in the first interlayer insulating layer 31, and the upper face of the first wiring layer 21 is exposed from the first interlayer insulating layer 31. Moreover, the upper face of the first wiring layer 21 and the upper face of the first interlayer insulating layer 31 constitute an identical face each other.

The first interlayer insulating layer 31 has the first via holes VH1 under the first wiring layer 21. The first via hole VH1 is formed to reach from the lower face of the first interlayer insulating layer 31 to the lower face of the first wiring layer 21.

The second wiring layer 22 is formed under the first interlayer insulating layer 31 and connected to the first wiring layer 21 through the via conductor in each first via hole VH1.

Also likewise, the second interlayer insulating layer 32 is formed to the lateral direction and lower sides of the second wiring layer 22. The second interlayer insulating layer 32 has the second via holes VH2 under the second wiring layer 22. The third wiring layer 23 is formed under the second interlayer insulating layer 32 and connected to the second wiring layer 22 through the via conductor in each second via hole VH2.

Also likewise, the third interlayer insulating layer 33 is formed to the lateral direction and lower sides of the third wiring layer 23. The third interlayer insulating layer 33 has the third via holes VH3 formed under the third wiring layer 23. The fourth wiring layer 24 is formed under the third interlayer insulating layer 33 and connected to the third wiring layer 23 through the via conductor in each third via hole VH3.

Further, the solder resist 12 is formed under the third interlayer insulating layer 33 as a protection insulating layer and the solder resist 12 in which the opening portions 12a are provided on the connecting parts of the fourth wiring layer 24.

The second to fourth wiring layers 22 to 24 are formed so as to protrude downward from the lower faces of the first, second, and third interlayer insulating layers 31 to 33, respectively.

Moreover, the first to third via holes VH1 to VH3 in the base wiring substrate 2 are formed in a taper shape in which the diameter is set small gradually from the lower face of the first, second, and third interlayer insulating layers 31, 32, 33 toward the thickness direction thereof.

Moreover, the fourth interlayer insulating layer 34 of the re-wiring portion 3 is formed on the first interlayer insulating layer 31 of the base wiring substrate 2. The fourth interlayer insulating layer 34 has the fourth via holes VH4 on the first wiring layer 21 of the base wiring substrate 2.

The first re-wiring layer 41 is formed on the fourth interlayer insulating layer 34 and connected to the first wiring layer 21 through the via conductor in each fourth via hole VH4. The fifth interlayer insulating layer 35 is formed on the fourth interlayer insulating layer 34 and has the fifth via holes VH5 on the first re-wiring layer 41.

The second re-wiring layer 42 is formed on the fifth interlayer insulating layer 35 and connected to the first re-wiring layer 41 through the via conductor in each fifth via hole VH5. The sixth interlayer insulating layer 36 is formed on the fifth interlayer insulating layer 35 and has the sixth via holes VH6 on the second re-wiring layer 42.

The third re-wiring layer 43 is formed in each sixth via hole VH6 as a post electrode, and connected to the second re-wiring layer 42, and protrudes upward from the sixth interlayer insulating layer 36.

Since the re-wiring portion 3 is formed on the base wiring substrate 2 which has been reversed up and down in the middle of the manufacturing, the fourth to sixth via holes VH4 to VH6 in the re-wiring portion 3 are arranged in a taper shape reverse to the first to third via holes VH1 to VH3 in the base wiring substrate 2.

The re-wiring portion 3 is formed from the first to third re-wiring layers 41 to 43 and the fourth to sixth interlayer insulating layers 34 to 36.

The wiring substrate 1 of this embodiment has such a structure that the re-wiring portion 3 is formed directly on the flat face of the base wiring substrate 2 of the coreless type at which the first wiring layer 21 is exposed. The respective widths of the first to third re-wiring layers 41 to 43 of the re-wiring portion 3 are set to be narrower than the respective widths of the first to fourth wiring layers 21 to 24 of the base wiring substrate 2.

Preferably, the respective re-wiring layers 41 to 43 of the re-wiring portion 3 are fine wirings having a line:space of 1 μm:1 μm to 5 μm:5 μm and can perform the function as the silicon interposer. Moreover, the respective thicknesses of the fourth to sixth interlayer insulating layers 34 to 36 of the re-wiring portion 3 are set to be thinner than the respective thicknesses of the first to third interlayer insulating layers 31 to 33 of the base wiring substrate 2.

As described above, in the wiring substrate 1 of this embodiment, the base wiring substrate 2 and the re-wiring portion 3 performing the function as the silicon interposer are formed integrally with each other.

For this reason, there is no need to use the silicon interposer in which the manufacturing cost and the technical hurdles are high.

Moreover, in the case of using the silicon interposer, the thickness of its silicon substrate is already about 100 μm or more, and as considering that multi-layer wiring layers are formed on both faces of the silicon substrate, there is a limitation when the thinner structure is required.

However, in the wiring substrate 1 of this embodiment, no silicon substrate is used in the re-wiring portion 3, and the thickness of each interlayer insulating layer can be set thinly to about 5 μm and the thickness of each re-wiring layer can be set thinly to about 2 μm to 3 μm. Therefore, the structure can be made thinner than when the silicon interposer is used.

Figure 14:
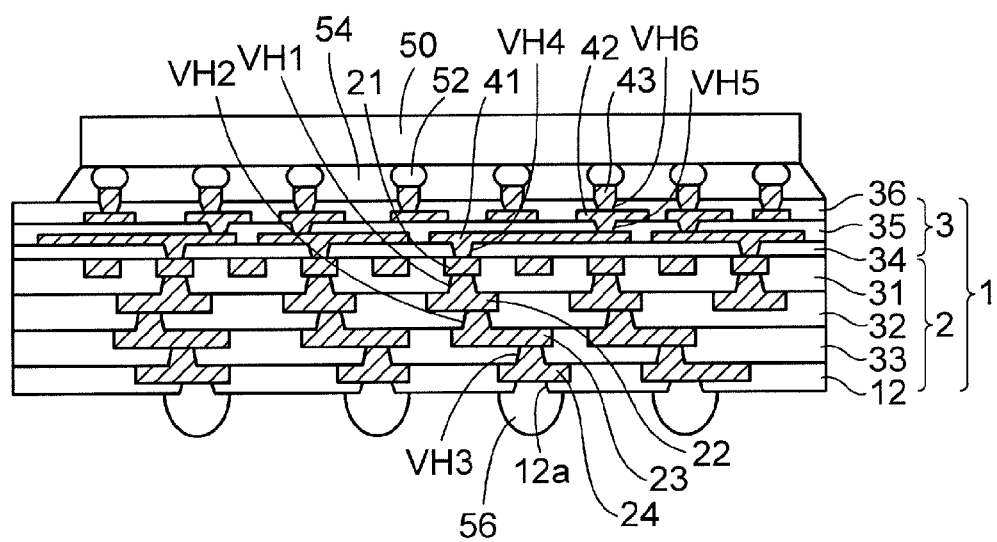
FIG. 14 is a cross-sectional view depicting an example of a semiconductor device in which a semiconductor chip is mounted on the wiring substrate in FIG. 13.

In FIG. 14, an example of a semiconductor device in which a semiconductor chip is mounted on the wiring substrate 1 in FIG. 13 is depicted. As depicted in FIG. 14, bump electrodes 52 of a semiconductor chip 50 are flip-chip connected to the third re-wiring layer 43 of the re-wiring portion 3 of the wiring substrate 1 in FIG. 13. Further, underfill resin 54 is filled in the gap between the semiconductor chip 50 and the re-wiring portion 3 of the wiring substrate 1.

Moreover, external connection terminals 56 are formed on the fourth wiring layer 24 located on the lower side of the base wiring substrate 2 of the wiring substrate 1, by mounting solder balls thereto, or the like.

In this way, the bump electrodes 52 of the semiconductor chip 50 arranged at a narrow pitch are connected to the re-wiring portion 3 including fine wirings, and thereby the pitch is converted from the re-wiring portion 3 to the base wiring substrate 2.

In the case of using the silicon interposer, a series of steps are needed which include mounting the silicon interposer onto the base wiring substrate and further mounting a semiconductor chip onto the silicon interposer. However, in this embodiment, it is only necessary to mount the semiconductor chip 50 onto the re-wiring portion 3 of the wiring substrate 1. Thus, the mounting step can be simplified.

The semiconductor chip 50 is illustrated as an electronic component which is to be mounted on the wiring substrate 1. The wiring substrate 1 can be used as a mounting substrate for various kinds of electronic components.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:
    forming a first wiring layer on a metal plate;
    forming a first insulating layer on the metal plate, the first insulating layer in which a first via hole is provided on the first wiring layer;
    forming a second wiring layer on the first insulating layer, the second wiring layer being connected to the first wiring layer through a via conductor in the first via hole;
    removing the metal plate;
    forming a second insulating layer on the first insulating layer, the second insulating layer in which a second via hole is provided on the first wiring layer;
    forming a seed layer in the second via hole and on the second insulating layer;
    forming a plating resist in which an opening portion is provided in an area including the second via hole;
    forming a metal plating layer in the second via hole and the opening portion of the plating resist by electroplating;
    removing the plating resist; and
    forming a re-wiring layer by removing the seed layer by anisotropic dry etching while using the metal plating layer as a mask.

(Clause 2) The method of manufacturing a wiring substrate according to Clause 1, wherein in the removing of the metal plate, a lower face of the first wiring layer and a lower face of the first insulating layer are exposed so as to constitute an identical face each other.

(Clause 3) The method of manufacturing a wiring substrate according to Clause 1, wherein in the forming of the seed layer, the seed layer is formed by sputtering.

(Clause 4) The method of manufacturing a wiring substrate according to Clause 1, wherein a width of the re-wiring layer is set to be narrower than each width of the first wiring layer and second wiring layer, and
    a thickness of the second insulating layer is set to be thinner than a thickness of the first insulating layer.

(Clause 5) The method of manufacturing a wiring substrate according to Clause 1, wherein a line:space of the re-wiring layer is selected from a range of 1 μm:1 μm to 5 μm:5 μm.

What is claimed is:

1. A wiring substrate, comprising:
    a base wiring substrate including
        a first wiring layer having a gold layer uppermost,
        a first insulating layer in which the first wiring layer is buried and a first via hole is formed under the first wiring layer, and
        a second wiring layer formed under the first insulating layer and connected to the first wiring layer through a via conductor in the first via hole; and
    a re-wiring portion including
        a second insulating layer formed on the base wiring substrate, the second insulating layer in which a second via hole is formed on the first wiring layer, wherein the second insulating layer contact the first wiring layer and the first insulating layer of the base wiring substrate, the second insulating layer made of resin and
        a re-wiring layer formed on the second insulating layer and connected to the first wiring layer through a via conductor in the second via hole, wherein the re-wiring layer extends from an inside of the second via hole to an upper face of the second insulating layer, and a pattern edge of the re-wiring layer is arranged on the upper face of the second insulating layer,
    wherein, the first via hole has a taper shape in which a diameter is set small gradually from the lower face of the first insulating layer toward the thickness direction thereof, and the second via hole has a taper shape reverse to the first via hole, and
    the re-wiring layer is formed of a seed layer and a metal plating layer formed on the seed layer, the seed layer has a two layer structure in which a copper layer is formed on a titanium layer, and the titanium layer directly contacts the second insulating layer, and
    a width of the seed layer is equal to or wider than a width of the metal plating layer.

2. The wiring substrate according to claim 1, wherein
    an upper face of the first wiring layer and an upper face of the first insulating layer in the base wiring substrate is arranged at the same height position, and
    the second wiring layer protrudes from the lower face of the first insulating layer.

3. The wiring substrate according to claim 1, wherein
    a width of the re-wiring layer is set to be narrower than each width of the first wiring layer and second wiring layer, and
    a thickness of the second insulating layer is thinner than a thickness of the first insulating layer.

4. The wiring substrate according to claim 1, wherein a line:space of re-wiring layer is selected from a range of 1 μm:1 μm to 5 μm:5 μm.

5. The wiring substrate according to claim 1, wherein the first wiring layer of the base wiring substrate has a three layer structure in which a copper layer, a nickel layer, and a gold layer are formed in order from a bottom.

* * * * *